United States Patent
Wu

(10) Patent No.: US 6,915,224 B2
(45) Date of Patent: Jul. 5, 2005

(54) METHOD FOR OPTIMUM SPECTRUM ANALYSIS

(76) Inventor: Jung-Ching Wu, No. 258, Hai-Shan 1st Rd., Hsiao-Kang Dist., Kaohsiung City (TW)

(*) Notice: Subject to any disclaimer, the term of this patent is extended or adjusted under 35 U.S.C. 154(b) by 162 days.

(21) Appl. No.: 10/280,378

(22) Filed: Oct. 25, 2002

(65) Prior Publication Data

US 2004/0083069 A1 Apr. 29, 2004

(51) Int. Cl.$^7$ .............................................. G01R 23/16
(52) U.S. Cl. ........................ 702/77; 702/199; 381/94.1
(58) Field of Search ................................ 704/214, 244, 704/253, 208; 702/199, 77; 381/94.1, 94.2, 94.3, 94.4, 94.7; 600/324; 324/76.22, 76.15, 76.19, 76.24; 375/224, 340; 374/130; 708/405, 276

(56) References Cited

U.S. PATENT DOCUMENTS

| | | | | |
|---|---|---|---|---|
| 3,581,199 A | * | 5/1971 | Spitz ........................ 324/76.24 |
| 4,054,785 A | * | 10/1977 | Lehmann .................... 708/405 |
| 4,559,602 A | * | 12/1985 | Bates, Jr. ..................... 702/71 |
| 5,327,521 A | * | 7/1994 | Savic et al. ................. 704/272 |
| 5,365,468 A | * | 11/1994 | Kakubo et al. ............. 708/313 |
| 5,442,696 A | * | 8/1995 | Lindberg et al. ............ 379/386 |
| 5,587,548 A | * | 12/1996 | Smith, III .................... 84/659 |
| 5,712,953 A | * | 1/1998 | Langs ........................ 704/214 |
| 5,809,455 A | * | 9/1998 | Nishiguchi et al. ......... 704/214 |
| 5,814,812 A | * | 9/1998 | Holzapfel .............. 250/231.16 |
| 6,073,100 A | * | 6/2000 | Goodridge, Jr. ............ 704/258 |
| 6,336,092 B1 | * | 1/2002 | Gibson et al. .............. 704/268 |
| 6,504,935 B1 | * | 1/2003 | Jackson ....................... 381/61 |
| 6,567,777 B1 | * | 5/2003 | Chatterjee ................... 704/246 |
| 6,574,573 B1 | * | 6/2003 | Asano ......................... 702/76 |
| 2003/0055610 A1 | * | 3/2003 | Webber ...................... 702/194 |

* cited by examiner

Primary Examiner—Carol S. W. Tsai
(74) Attorney, Agent, or Firm—Townsend and Townsend and Crew LLP

(57) ABSTRACT

In a method of spectrum analysis, a sample signal, which is obtained by sampling an original signal at an original sampling rate within a sampling period, is transformed into a spectrum to be measured according to a frequency range scale. An optimum graduation interval of the frequency range scale is determined in accordance with frequency and amplitude parameters of the spectrum. An updated sampling rate is determined by multiplying the original sampling rate by the optimum graduation interval. The original signal is re-sampled at the updated sampling rate within the sampling period so as to obtain an updated sample signal. An optimum sample signal is obtained by multiplying the updated sample signal by a scale shift function that is based on the optimum graduation interval and the frequency and amplitude of the spectrum. Finally, the optimum sample signal is transformed into an optimized spectrum.

8 Claims, 7 Drawing Sheets

|  | analyzed value |
|---|---|
| fundamental harmonic component | $A_x$:952.2<br>$f_x$:59.7 |
| 5$^{th}$ harmonic component | $A_x$:190.9<br>$f_x$:298.5 |
| 7$^{th}$ harmonic component | $A_x$:136.5<br>$f_x$:417.9 |

$A_x$:amplitude , $f_x$:frequency(Hz)

FIG. 7

|  | actual value | analysis by FFT | present invention |
|---|---|---|---|
| fundamental harmonic component | A:952.9<br>f:59.7 | A:816.2<br>f:60.0 | A:952.7<br>f:59.7 |
| 5$^{th}$ harmonic component | A:191.0<br>f:298.5 | A:122.2<br>f:298.0 | A:191.0<br>f:298.5 |
| 7$^{th}$ harmonic component | A:136.4<br>f:417.9 | A:134.2<br>f:418.0 | A:136.4<br>f:417.9 |

A:amplitude , f:frequency(Hz)

FIG. 8

METHOD FOR OPTIMUM SPECTRUM ANALYSIS

BACKGROUND OF THE INVENTION

1. Field of the Invention

The invention relates to a method of spectrum analysis, more particularly to a method for optimum spectrum analysis.

2. Description of the Related Art

Conventional harmonic measuring equipments, such as a spectrum analyzer, a harmonic analyzer, a distortion analyzer and a digital harmonics measuring device, utilize Fast Fourier transformation for spectrum analysis. However, when a harmonic frequency of a sample signal is not a multiple of frequency resolution, there are a grating effect due to frequency distortion and a leakage effect due to amplitude distortion generated in a spectrum transformed from the sample signal by Fast Fourier transformation.

The following are two methods proposed in the art to reduce the grating effect and leakage effect. A window method of multiplying a sample signal by a window function is used to overcome discontinuation at truncation points in a spectrum so as to eliminate side lobe components in the spectrum. Although the window method can reduce the leakage effect, characteristics of spectrum have been changed. A zero padding method can be used to solve the grating effect but cannot improve the leakage effect due to the decreased amplitude.

Moreover, in order to maintain the characteristics of the spectrum, a method has been proposed heretofore to select an updated graduation interval that is a common factor of harmonic frequencies. However, there is a relatively great difference between the common factor and an original graduation interval such that the method cannot be used in an actual practice. Thus, the updated graduation interval is not an optimum graduation interval.

SUMMARY OF THE INVENTION

Therefore, an object of the present invention is to provide a method of spectrum analysis that can effectively reduce grating and leakage effects in a spectrum.

According to the present invention, there is provided a method of spectrum analysis for analyzing a sample signal that is obtained by sampling an original signal at an original sampling rate within a sampling period. The method comprises the steps of:

(a) transforming the sample signal into a spectrum to be measured according to a frequency range scale;

(b) determining an optimum graduation interval of the frequency range scale in accordance with characteristics of the spectrum, the characteristics including at least one of frequency and amplitude parameters of the spectrum;

(c) determining an updated sampling rate by multiplying the original sampling rate by the optimum graduation interval, and re-sampling the original signal at the updated sampling rate within the sampling period so as to obtain an updated sample signal;

(d) obtaining an optimum sample signal by-multiplying the updated sample signal by a scale shift function that is based on the optimum graduation interval and the characteristics of the spectrum; and (e) transforming the optimum sample signal into an optimized spectrum.

BRIEF DESCRIPTION OF THE DRAWINGS

Other features and advantages of the present invention will become apparent in the following detailed description of the preferred embodiment with reference to the accompanying drawings, of which:

FIG. 7 is a table showing reference amplitude and frequency analyzed from the spectrum of FIG. 3;

FIG. 8 is a table showing a comparison result among actual amplitude and frequency parameters analyzed by conventional Fast Fourier transformation and the preferred embodiment of the present invention;

DETAILED DESCRIPTION OF THE PREFERRED EMBODIMENT

Figure 1:
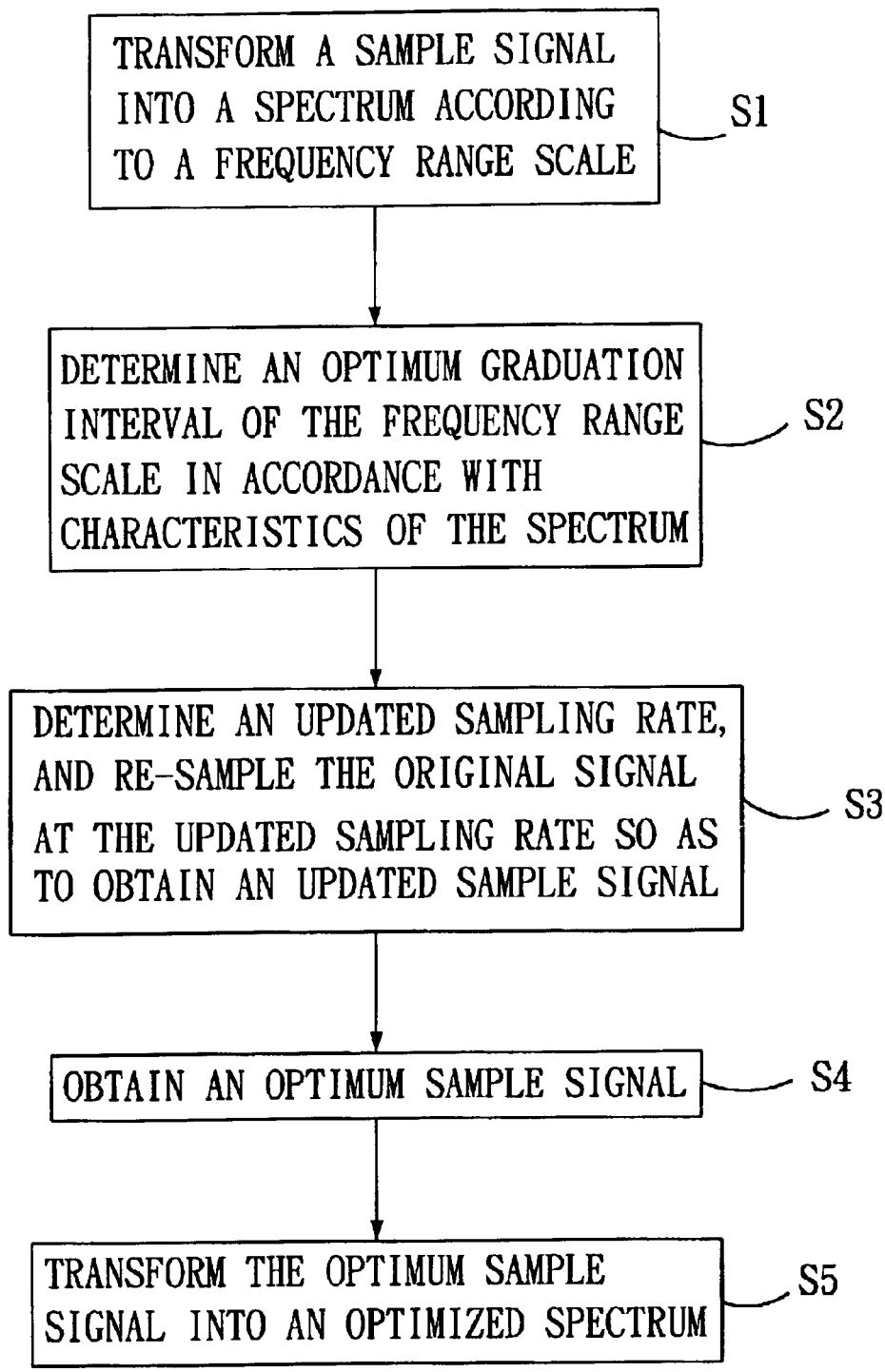
FIG. 1 is a flow chart illustrating the preferred embodiment of a method for optimum spectrum analysis of a sample signal according to the present invention.

Referring to FIG. 1, the preferred embodiment of a method of spectrum analysis for analyzing a sample signal according to the present invention is shown. The sample signal is obtained by sampling an original signal at an original sampling rate (R) within a sampling period (T). In order to avoid aliasing effect in the spectrum analysis, the original sampling rate (R) is greater than twice a bandwidth of the original signal based on sampling theories, and the sampling period (T) contains at least three identical waveforms when the original signal is a periodic signal.

For example, the original signal x(t), such as a periodic signal having a period (T), can be expressed by a Fourier series, that is, $$x(t) = \frac{a(0)}{2} + \sum_{m=1}^{\infty}\left[a(m)\cos\frac{2\pi m}{T}t + b(m)\sin\frac{2\pi m}{T}t\right],$$

$$0 \le t \le T, \text{ where } a(m) = \frac{2}{T}\int_{t_0}^{t_0+T} x(t)\cos\frac{-2\pi mt}{T}dt,$$

$$b(m) = \frac{2}{T}\int_0^{0+T} x(t)\sin\frac{-2\pi mt}{T}dt.$$

The original signal x(t) can also be expressed in complex form, that is, $$x(t) = \sum_{m=-\infty}^{\infty} c(m)\exp\left(\frac{j2\pi m}{T}\right)t, \; 0 \leq t \leq T,$$

$$\text{where } c(m) = \frac{1}{T}\int_0^{0+T} x(t)\exp\left(\frac{-j2\pi m}{T}t\right)dt.$$

As such, the sample signal x(n) is obtained by sampling the original signal x(t) at the original sampling rate (R) within the sampling period (T), that is, $$x(n) = \sum_{m=0}^{N-1} X(m)\exp\left(\frac{j2\pi mn}{T}\right), \; n = 0, 1, 2, \ldots, N-1,$$

N-1, where "n" represents a $n^{th}$ graduation in a time domain. On the other hand, the sample signal x(n) can contain of K independent harmonics components, that is, $$x(n) = \sum_{k=1}^{K} A_x(k)\cos[2\pi f_x(k)n/N + \phi_x(k)], \quad \text{(Equation 1)}$$

$$n = 0, 2, \ldots, N-1$$

where $A_x(k)$ represents an amplitude of a harmonic component, $\phi_x(k)$ represents a phase of a harmonic component, and $f_x(k)$ represents a frequency graduation of a harmonic component.

Figure 2:
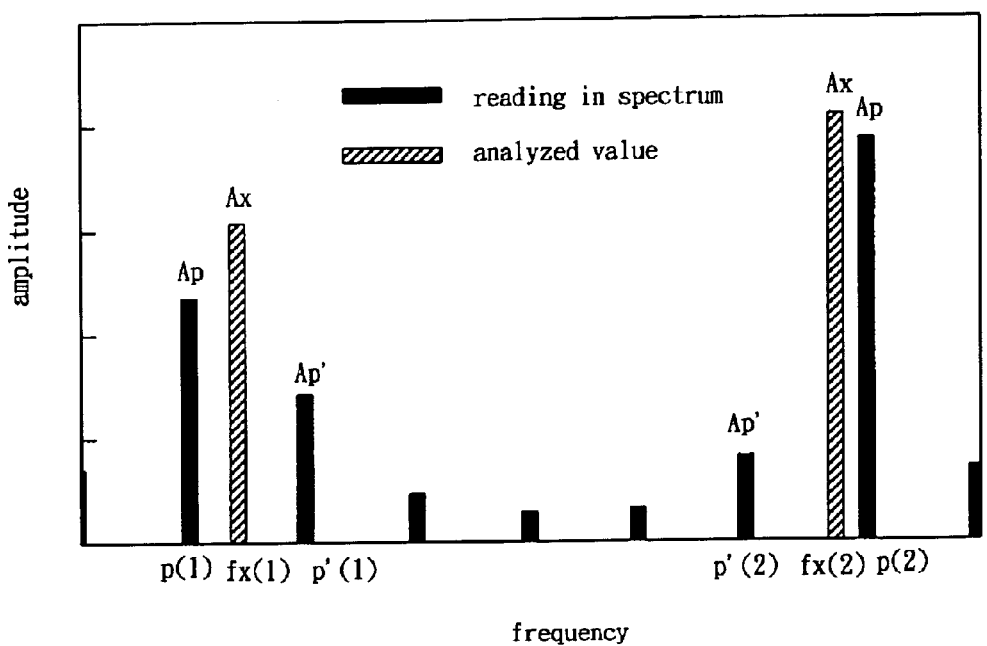
FIG. 2 shows a spectrum obtained by Fast Fourier transformation of the sample signal.

In step S1 of the method of the preferred embodiment, the sample signal x(n) is transformed into a spectrum to be measured according to a frequency range scale, as shown in FIG. 2. In this embodiment, preferably, transforming of the sample signal x(n) is accomplished by a Fast Fourier Transformation by virtue of a high speed during calculation. As such, the sample signal x(n) can be transformed into a transformed signal X(m) that is, $$X(m) = \frac{1}{N}\sum_{n=0}^{N-1} x(n)\exp\left(\frac{-j2\pi mn}{N}\right), \; m = 0, 1, 2, \ldots, N-1,$$

where "m" represents a $m^{th}$ graduation in a frequency domain.

According to Equation 1, the transformed signal X(m) can further be expressed as $$X(m) = \frac{1}{2N}\sum_{k=1}^{K}\sum_{n=0}^{N-1} A_x(k)e^{-j2\pi mn/N}(e^{j(2\pi f_x(k)n/N+\phi_x(K))} + e^{-j(2\pi f_x(k)n/N+\phi_x(k))})$$

$$= \sum_{k=1}^{K}\frac{A_x(k)}{2N}e^{j\phi_x(k)}\sum_{n=0}^{N-1} e^{j2\pi(f_x(k)-m)n/N} + \sum_{k=1}^{K}\frac{A_x(k)}{2N}e^{-j\phi_x(k)}\sum_{n=0}^{N-1} e^{-j2\pi(f_x(k)+m)n/N}$$

$$= \sum_{k=1}^{K}\frac{A_x(k)}{2N}e^{j\phi_x(k)}\frac{e^{j2\pi(f_x(k)-m)}}{e^{j2\pi(f_x(k)-m)/N}} + \sum_{k=1}^{K}\frac{A_x(k)}{2N}e^{-j\phi_x(k)}\frac{1-e^{-j2\pi(f_x(k)+m)}}{1-e^{-j2\pi(f_x(k)+m)/N}}$$

As such, the transformed signal X(m) can be expressed into a form of vectors, that is, $$X(m) = \sum_{k=1}^{K}[A(k,m)L\phi(k,m) + A^-(k,m)L\phi^-(k,m)], \quad \text{(Equation 2)}$$

$$m = 1, 2, \ldots, N-1$$

$$\text{where } A(k,m) = \frac{A_x(k)}{2N}\left[\frac{\sin\pi(f_x(k)-m)}{\sin\pi(f_x(k)-m)/N}\right],$$

$$\phi(k,m) = \phi_x(k) + \pi(f_x(k)-m)(N-1)/N,$$

$$A^-(k,m) = \frac{A_x(k)}{2N}\left[\frac{\sin\pi(f_x(k)+m)}{\sin\pi(f_x(k)+m)/N}\right], \text{ and}$$

$$\phi^-(k,m) = -\phi_x(k) - \pi(f_x(k)+m)(N-1)/N$$

In step 2, according to characteristics, which include frequency and amplitude parameters, of the spectrum, as shown in FIG. 2, the amplitude ($A_p$) of a largest frequency component for each harmonic component in the spectrum is expressed as a function of the frequency (p) of the largest frequency component and the reference frequency ($f_x$), that is, $$A_p = \frac{A_x}{2N}\frac{\sin\pi(f_x-p)}{\sin\pi(f_x-p)/N} \quad \text{(Equation 3)}$$

Similarly, the amplitude ($A_{p'}$) of a second largest frequency component for each harmonic component in the spectrum is expressed as a function of the frequency (p') of the second largest frequency component and the reference frequency ($f_x$), that is, $$A'_p = \frac{A_x}{2N}\frac{\sin\pi(f_x-p')}{\sin\pi(f_x-p')/N} \quad \text{(Equation 4)}$$

Thus, according Equations 3 and 4, one can obtain $$\frac{A_p}{A'_p} = \frac{\sin\pi(f_x-p)\sin\pi(f_x-p')/N}{\sin\pi(f_x-p')\sin\pi(f_x-p)/N} = \frac{-\sin\pi(f_x-p')/N}{\sin\pi(f_x-p)/N}$$

$$= -\left[\cos\frac{\pi(p'-p)}{N} - \sin\frac{\pi(p'-p)}{N}\cot\frac{\pi(f_x-p)}{N}\right]$$

such that the reference frequency ($f_x$) can be determined from the amplitude expressions obtained in Equations 3 and 4, that is, $$f_x = p + (p' - p)\frac{A_{p'}}{A_p + A_{p'}} \quad \text{(Equation 5)}$$

and that a frequency shift ($f_d$) can be determined as a frequency difference between the frequency (p) of the largest frequency component in the spectrum and the reference frequency ($f_x$) obtained in Equation 5, that is, $$f_d = f_x - p \quad \text{(Equation 6)}$$

According to Equations 3 and 5, a reference amplitude ($A_x$) is approximately determined as a function of the amplitude ($A_p$) of the largest frequency component in the spectrum and the frequency shift ($f_d$) obtained in Equation 6, that is, $$A_x \cong \frac{2\pi f_d}{\sin\pi f_d} A_p \quad \text{(Equation 7)}$$

If the original signal x(t) has K harmonic components, a total energy ($S^2$) of the original signal x(t) can be expressed as a function, such as $$S^2 = \frac{1}{2}\sum_{k=1}^{K} A_x^2(k),$$

and, in this case, according to Parseval's theorem, the total energy ($S^2$) of the original signal x(t) can be expressed as a function, such as $$S^2 = 2\sum_{k=1}^{K} A_p^2(k) + 2L,$$

where "L" represents a leakage energy in the spectrum, such that $$\frac{1}{2}\sum_{k=1}^{K} A_x^2(k) = 2\sum_{k=1}^{K} A_p^2(k) + 2L.$$

Thus, according to Equation 7

$$\left(A_x \cong \frac{2\pi f_d}{\sin\pi f_d} A_p\right),$$

the amplitude ($A_p$) of a largest frequency component can be expressed as a Taylor series expansion, that is, $$A_p = \quad \text{(Equation 8)}$$
$$A_x\left(\lim_{f_d \to 0}\frac{\sin\pi f_d}{2\pi f_d} + \lim_{f_d \to 0}\frac{(\cos\pi f_d)(2\pi^2 f_d) - 2\pi\sin\pi f_d}{(2\pi f_d)^2} f_d + \ldots\right)$$

whereas, according to L'Hospital's rule, $$\lim_{f_d \to 0}\frac{\sin\pi f_d}{2\pi f_d} = \frac{\pi\cos\pi f_d}{2\pi} = \frac{1}{2}\cos\pi f_d, \text{ and}$$

$$\lim_{f_d \to 0}\frac{(\cos\pi f_d)(2\pi^2 f_d) - 2\pi\sin\pi f_d}{(2\pi f_d)^2} =$$

$$\lim_{f_d \to 0}\frac{\pi^2(-\sin\pi f_d)(2\pi f_d) + 2\pi^2\cos\pi f_d - 2\pi^2\cos\pi f_d}{4\pi(2\pi f_d)} = \frac{-\pi\sin\pi f_d}{4}.$$

Thus, Equation 8 can be simplified as $$A_p = A_x\left(\frac{1}{2}\cos\pi f_d - \frac{\pi}{4}f_d\sin\pi f_d + \ldots\right)$$

and approximately becomes $$A_p \cong A_x\left(\frac{1}{2}\cos\pi f_d\right)$$

such that the leakage energy (L) corresponding to the spectrum can be expressed as a function of the reference frequency ($f_x$) obtained in Equation 5 and the frequency shift ($f_d$) obtained in Equation 6, that is, $$L \cong \sum_{k=1}^{K}\left(\frac{A_x(k)}{2}\sin\pi f_d(k)\right)^2 \quad \text{(Equation 9)}$$

Without changing the characteristics of the original signal x(t), it is necessary to obtain an optimal scale in the spectrum in order to minimize the leakage energy (L). First, an updated graduation interval ($S_i$) corresponding to an updated scale is selected. In this case, a frequency shift ($f'_d$) for each harmonic component corresponding to the updated scale is determined as a function of the reference frequency ($f_x$) and the updated graduation interval ($S_i$), that is, $$f'_d = f_x - S_i m, \; m=0, 1, \ldots, N \quad \text{(Equation 10)}$$

where the condition that $(f_x - S_i m)^2$ is a minimum value must be satisfied. Thus, according to Equation 9, the leakage energy (L) corresponding to an updated spectrum with the updated scale can be expressed as a function of the reference amplitude ($A_x$), the frequency shift ($f'_d(k)$) corresponding to the updated scale, the updated graduation interval ($S_i$), and a scale shift ($S_s$), that is, $$L \cong \sum_{k=1}^{K}\left[\frac{A_x(k)}{2}\sin\pi\left(\frac{f'_d(k) - S_s}{S_i}\right)\right]^2 \quad \text{(Equation 11)}$$

If the frequency shift ($f'_d(k)$) for a $k^{th}$ harmonic component is approximately equal to the scale shift ($S_s$) Equation 11 can further be expressed as $$L \cong \sum_{k=1}^{K}\left[\frac{A_x(k)}{2}\pi\left(\frac{f'_d(k) - S_s}{S_i}\right)\right]^2 \quad \text{(Equation 12)}$$

On the other hand, if $$\frac{\partial L}{\partial S_s} = 0,$$

the leakage energy (L) corresponding to an updated spectrum will be minimum. As such, based on the above assumption, the scale shift ($S_s$) can be expressed as $$S_s = \frac{\sum_{k=1}^{K} A_x^2(k) f_d'(k)}{\sum_{k=1}^{K} A_x^2(k)} \quad \text{(Equation 13)}$$

Thus, according to Equations 12 and 13, the minimum leakage energy ($L_{min}(S_i)$) can be expressed as $$L_{min}(S_i) = \quad \text{(Equation 14)}$$

$$\left(\frac{\pi}{2S_i}\right)^2 \sum_{k'=1}^{K} \left[ \frac{A_x(k') \sum_{k=1}^{K} A_x^2(k)(f_d'(k') - f_d'(k))}{\sum_{k=1}^{K} A_x^2(k)} \right]^2$$

Therefore, an optimum graduation interval ($S_i$) can be obtained when the minimum leakage energy ($L_{min}(S_i)$) has a minimum value within a predetermined frequency range.

In step 3, according to the optimum graduation interval ($S_i$), an updated sampling rate (R') is determined by multiplying the original sampling rate (R) by the optimum graduation interval ($S_i$) (that is, R=$S_i$×R). Then, the original signal x(t) is re-sampled at the updated sampling rate (R') within the sampling period so as to obtain an updated sample signal x(n'). In this embodiment, re-sampling of the original signal x(t) is accomplished by a $l^{th}$ order polynomial Lagrange's interpolation method. Therefore, an updated sample signal x(n') can be expressed as $$x(n') = \sum_{i=0}^{l} \left[ \prod_{j=0, j\neq i}^{l} \frac{n' - n_j}{n_i - n_j} \right] x(n_i),$$

where "x($n_i$)" represents the original sample signal, and "n'" represents an updated graduation (time domain).

In step 4, the optimum sample signal ((x'(n')) is obtained by multiplying the updated sample signal (x(n')) by a scale shift function. The scale shift function includes a sine function of a scale shift ($S_s$) (i.e., sin(2πn$S_s$/N)) and a cosine function of the scale shift ($S_s$) (i.e., cos(2πn$S_s$/N)). According to Equation 13, the scale shift ($S_s$) is based on the optimum graduation interval ($S_i$) and the characteristics of the spectrum. The optimum sample signal thus obtained is x'(n')=x(n')×cos(2πn$S_s$/N)+[x(n')×sin(2πn$S_s$/N)] i·Multiplication by the scale shift function to obtain the optimum sample signal ((x'(n')) is necessary in view of frequency shift characteristics in Fourier transformation.

In step 5, the optimum sample signal ((x'(n')) is transformed into an optimized spectrum by Fast Fourier transformation. As such, the optimum sample signal ((x'(n')) can be transformed into a transformed signal X'(m), that is, $$X'(m) = X_r'(m) + X_i'(m), m = 1, 2, \ldots, N, \text{ where}$$

$$X_r'(m) = \frac{1}{N} \sum_{n'=0}^{N-1} x(n') \cos\left(2\pi n' \frac{S_s}{N}\right) \exp\left(-j2\pi n' \frac{m}{N}\right)$$

$$X_i'(m) = \frac{j}{N} \sum_{n'=0}^{N-1} x(n') \sin\left(2\pi n' \frac{S_s}{N}\right) \exp\left(-j2\pi n' \frac{m}{N}\right)$$

Therefore, the optimized spectrum is obtained.

Figure 3:
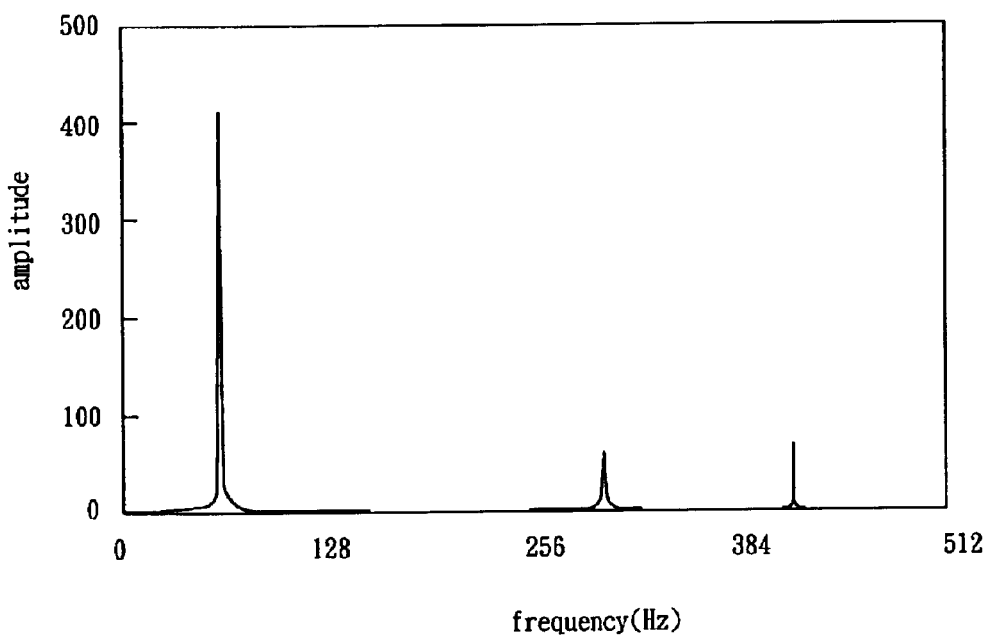
FIG. 3 shows an example of a spectrum obtained by Fourier transformation of a periodic signal.
Figure 3A:
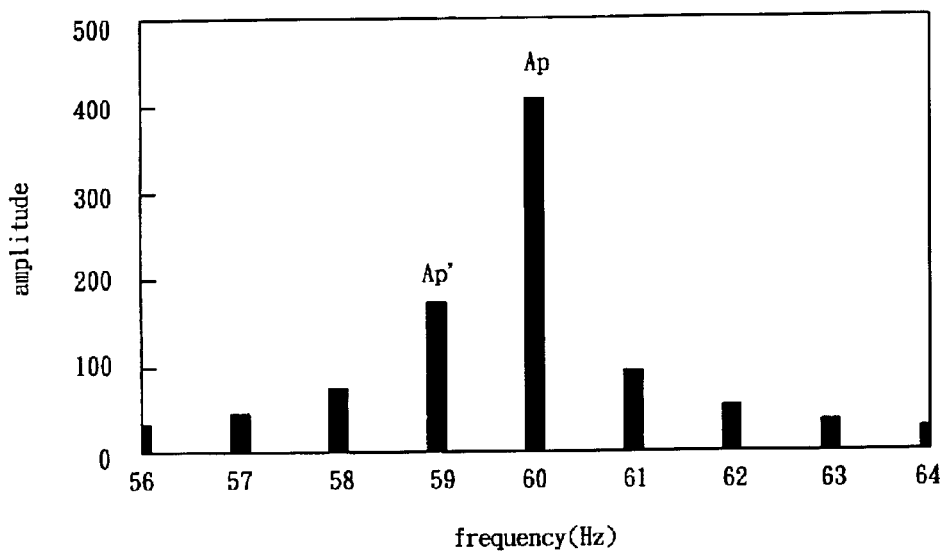
FIG. 3A shows a portion of the spectrum of FIG. 3 close to a fundamental frequency.
Figure 4:
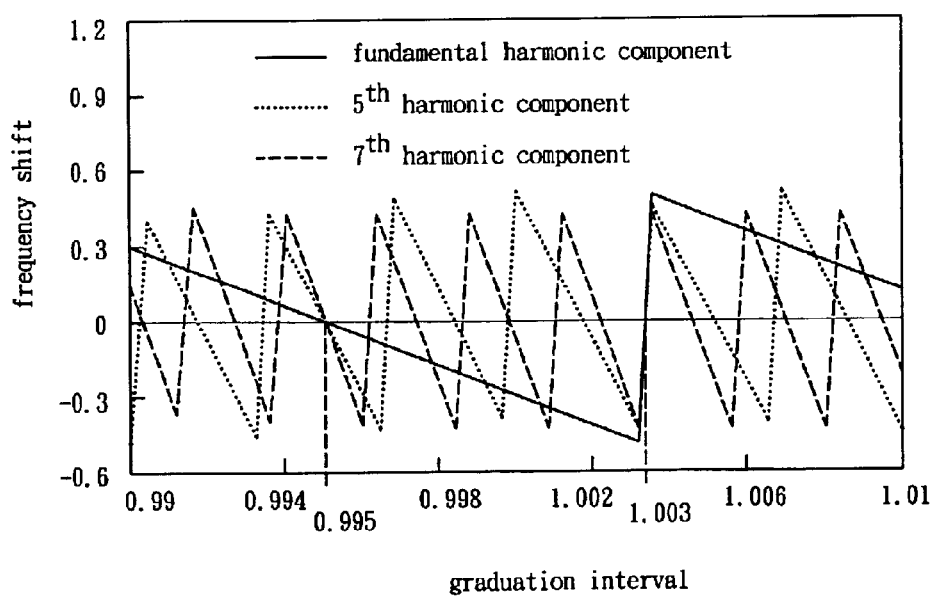
FIG. 4 shows a relationship between a frequency shift and an optimum graduation interval corresponding to the spectrum of the periodic signal in FIG. 3 according to the preferred embodiment.
Figure 5:
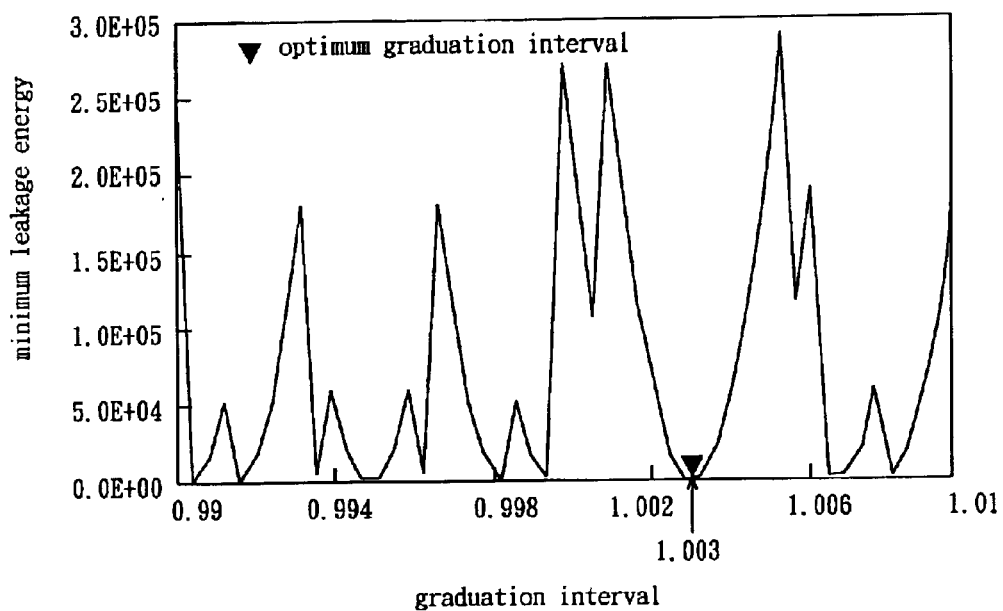
FIG. 5 shows a relationship between minimum leakage energy and a graduation interval corresponding to the spectrum of the periodic signal in FIG. 3 according to the preferred embodiment.
Figure 6:
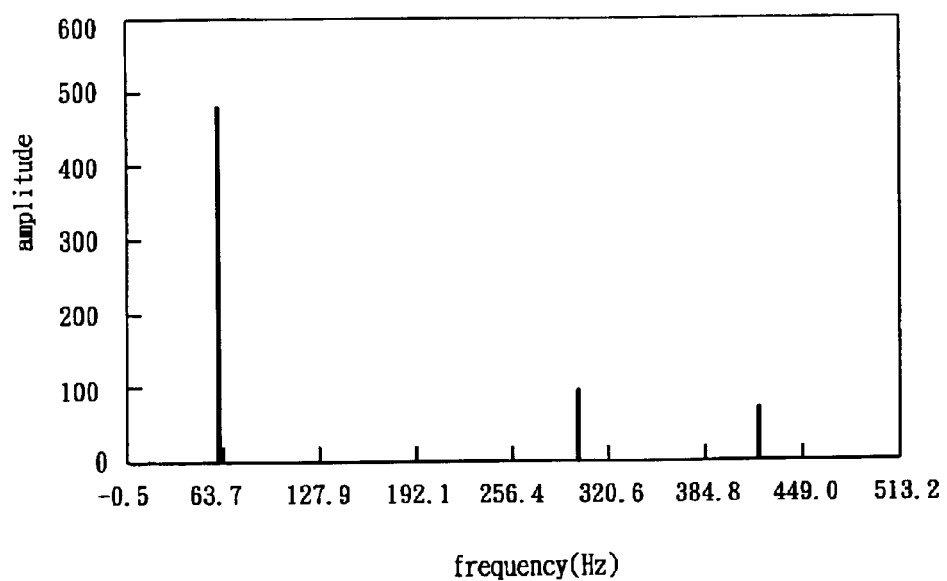
FIG. 6 shows an optimum spectrum of a pulse width modulation signal according to the preferred embodiment.

Referring to FIGS. 3 to 6, there is provided an example for analyzing a sample signal (x(n)) according to the preferred embodiment of the present invention. The sample signal (x(n)) is obtained by sampling a periodic signal, such as a pulse width modulation (PWM) signal, at an original sampling rate of 1024 data within a sampling period of 1 sec. The sample signal (x(n)) includes fundamental, $5^{th}$ and $7^{th}$ harmonic components, i.e., x(n)=952.9 cos(2π*59.7*n/N−π/2)+191.0 cos(2π*298.5*n/N−π/2)+136.4 cos(2π*417.9*n/N−π/2), n=0, 1, 2, ..., N−1. The sample signal (x(n)) is transformed by Fast Fourier transformation so as to generate a spectrum, as shown in FIG. 3. FIG. 3A illustrates a portion of the spectrum in FIG. 3 close to a fundamental frequency. In FIG. 3A, there is shown a fundamental harmonic component from which p=60.0, p'=59, $A_p$=408.1 and $A_{p'}$=408.1 can be obtained. Then, according to Equations 5 to 7, the reference frequency and amplitude ($f_x$, $A_x$) for each harmonic component can be determined, as shown in FIG. 7. In step 2, in order to minimize the leakage energy, according to Equation 10, the optimum graduation interval ($S_i$) within a range of 0.99–1.01 can be determined, as shown in FIG. 4. It is noted that the frequency shifts in fundamental, $5^{th}$ and $7^{th}$ harmonic components are equal to each other (i.e., the frequency shifts are equal to zero) when the graduation interval is at 0.995 and 1.003. In other words, the leakage energy is minimum when the graduation interval is at 0.995 and 1.003. According to Equation 14, the minimum leakage energy corresponding to the graduation interval is obtained as shown in FIG. 5. It is noted that the minimum leakage energy is approximately equal to zero (a minimum value) when the graduation interval is at 1.003. As such, the optimum graduation interval is equal to 1.003, and the scale shift approximately equal to −0.5 can thus be obtained based on Equation 13. Therefore, the scale function is thus determined. After re-sampling the PWM signal at the updated sampling rate of 1.0034*1024 by fourth order polynomial Lagrange's interpolation method, the updated sample signal is obtained. Then, the optimum sample signal is obtained by multiplying the updated sample signal by the scale shift function. Finally, the optimized spectrum is obtained by Fast Fourier transformation of the optimum sample signal, as shown in FIG. 6. It is apparent that energy in each harmonic component is concentrated at a graduation such that grating effect and leakage effect can thus be reduced. It is noted that the method of spectrum analysis of the present invention can provide an analysis result approximately equal to an actual analysis result and better than that of the spectrum obtained by conventional Fast Fourier transformation, as shown in FIG. 8.

Figure 9:
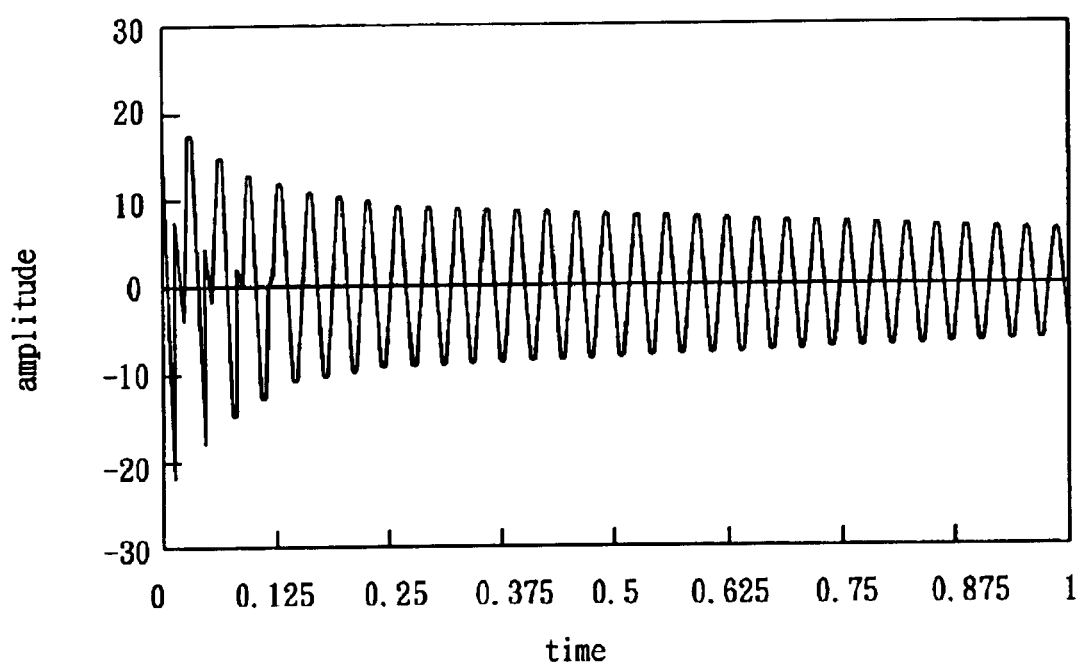
FIG. 9 shows an impulse response signal of an RLC circuit.
Figure 10:
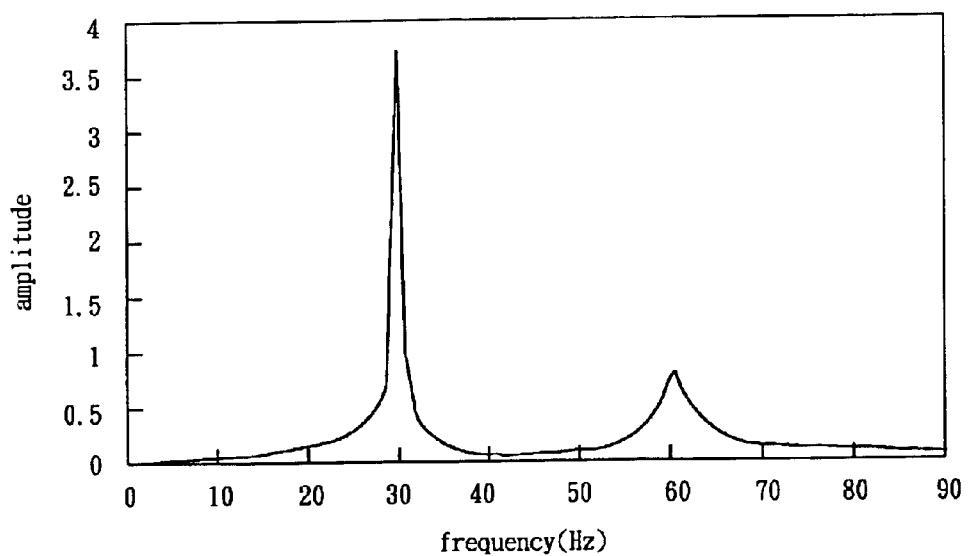
FIG. 10 shows a spectrum analyzed by conventional Fast Fourier transformation of the impulse response signal of FIG. 9.
Figure 11:
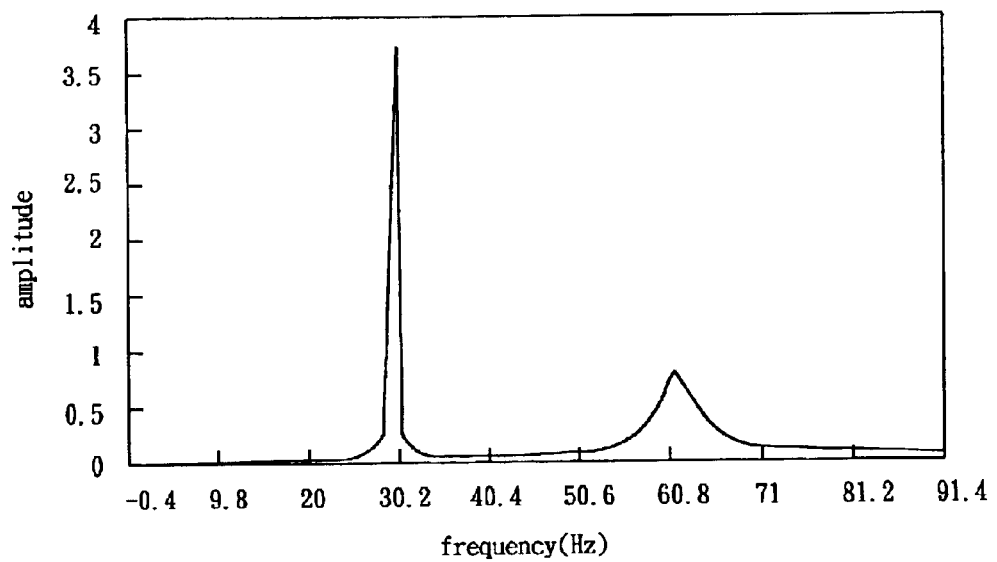
FIG. 11 shows an optimum spectrum of the impulse response signal of FIG. 9 analyzed by the preferred embodiment of the present invention.

Referring to FIGS. 9 to 11, there is provided another example for analyzing a sample signal according to the preferred embodiment of the present invention. The sample signal is obtained by sampling a non-periodic signal x(t) generated by an impulse response of a RLC circuit, as shown in FIG. 9, at an original sampling rate of 512 data within a sampling period of 1 sec. According to the above steps, the optimum graduation interval is equal to 1.02 and the scale shift is approximately equal to −0.4. Therefore, the optimized spectrum, as shown in FIG. 11, analyzed by the present invention can reduce leakage effect as compared to the spectrum, as shown in FIG. 10, analyzed by conventional Fast Fourier transformation.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A method of spectrum analysis for analyzing a sample signal that is obtained by sampling an original signal at an original sampling rate within a sampling period, said method comprising the steps of:
   (a) Fourier transforming the sample signal into a spectrum to be measured according to a frequency range scale;
   (b) determining an optimum graduation interval of the frequency range scale in accordance with characteristics of the spectrum, the characteristics including at least one of frequency and amplitude parameters of the spectrum;
   (c) determining an updated sampling rate by multiplying the original sampling rate by the optimum graduation interval, and re-sampling the original signal at the updated sampling rate within the sampling period so as to obtain an updated sample signal;
   (d) obtaining an optimum sample signal by multiplying the updated sample signal by a scale shift function that is based on the optimum graduation interval and the characteristics of the spectrum; and
   (e) transforming the optimum sample signal into an optimized spectrum;
   wherein the original sampling rate is greater than twice a bandwidth of the original signal, and the sampling period contains at least three identical waveforms when the original signal is a periodic signal.

2. The method as claimed in claim 1, wherein transforming of the sample signal in step (a) is accomplished by Fast Fourier Transformation.

3. The method as claimed in claim 1, wherein transforming of the sample signal in step (a) is accomplished by Discrete Fourier Transformation.

4. The method as claimed in claim 1, wherein step (b) includes the sub-steps of:
   (b-1) expressing the amplitude of a largest frequency component in the spectrum as a function of the frequency of the largest frequency component and a reference frequency;
   (b-2) expressing the amplitude of a second largest frequency component in the spectrum as a function of the frequency of the second largest frequency component and the reference frequency;
   (b-3) determining the reference frequency from the amplitude expressions obtained in steps (b-1) and (b-2);
   (b-4) determining a frequency shift by obtaining a frequency difference between the frequency of the largest frequency component in the spectrum and the reference frequency obtained in step (b-3);
   (b-5) determining a reference amplitude as a function of the amplitude of the largest frequency component in the spectrum and the frequency shift obtained in step (b-4);
   (b-6) determining a leakage energy function that includes the reference amplitude obtained in step (b-5), the reference frequency obtained in step (b-3), and the optimum graduation interval; and
   (b-7) determining the optimum graduation interval that results in the least value of the leakage energy function obtained in step (b-6) has a minimum value.

5. The method as claimed in claim 4, wherein the scale shift function includes a sine function of a scale shift and a cosine function of a scale shift, the scale shift being based on the optimum graduation interval and the characteristics of the spectrum.

6. The method as claimed in claim 1, wherein re-sampling of the original signal in step (c) is accomplished by a polynomial Lagrange's interpolation method.

7. A method of spectrum analysis for analyzing a sample signal that is obtained by sampling an original signal at an original sampling rate within a sampling period, said method comprising the steps of:
   (a) Fourier transforming the sample signal into a spectrum to be measured according to a frequency range scale;
   (b) determining an optimum graduation interval of the frequency range scale in accordance with characteristics of the spectrum, the characteristics including at least one of frequency and amplitude parameters of the spectrum, wherein determining an optimum graduation interval includes the sub-steps of:
   (b-1) expressing the amplitude of a largest frequency component in the spectrum as a function of the frequency of the largest frequency component and a reference frequency;
   (b-2) expressing the amplitude of a second largest frequency component in the spectrum as a function of the frequency of the second largest frequency component and the reference frequency;
   (b-3) determining the reference frequency from the amplitude expressions obtained in steps (b-1) and (b-2);
   (b-4) determining a frequency shift by obtaining a frequency difference between the frequency of the largest frequency component in the spectrum and the reference frequency obtained in step (b-3);
   (b-5) determining a reference amplitude as a function of the amplitude of the largest frequency component in the spectrum and the frequency shift obtained in step (b-4);
   (b-6) determining a leakage energy function that includes the reference amplitude obtained in step (b-5), the reference frequency obtained in step (b-3), and the optimum graduation interval; and
   (b-7) determining the optimum graduation interval that results in the least value of the leakage energy function obtained in step (b-6) has a minimum value;
   (c) determining an updated sampling rate by multiplying the original sampling rate by the optimum graduation interval, and re-sampling the original signal at the updated sampling rate within the sampling period so as to obtain an updated sample signal;
   (d) obtaining an optimum sample signal by multiplying the updated sample signal by a scale shift function that is based on the optimum graduation interval and the characteristics of the spectrum; and
   (e) transforming the optimum sample signal into an optimized spectrum.

8. The method as claimed in claim 7, wherein the original sampling rate is greater than twice a bandwidth of the original signal, and the sampling period contains at least three identical waveforms when the original signal is a periodic signal.

* * * * *